United States Patent
Lin et al.

(10) Patent No.: US 12,500,606 B2
(45) Date of Patent: Dec. 16, 2025

(54) ANTI-GHOSTING KEYBOARD

(71) Applicant: SUNREX TECHNOLOGY CORP., Taichung (TW)

(72) Inventors: Shih-Pin Lin, Taiwan (TW); Pei-Sin Lin, Taichung (TW); Hsing-Kuang Chen, Taichung (TW)

(73) Assignee: SUNREX TECHNOLOGY CORP., Taichung (TW)

( * ) Notice: Subject to any disclaimer, the term of this patent is extended or adjusted under 35 U.S.C. 154(b) by 0 days.

(21) Appl. No.: 18/767,114

(22) Filed: Jul. 9, 2024

(65) Prior Publication Data

US 2025/0317157 A1 Oct. 9, 2025

(30) Foreign Application Priority Data

Apr. 8, 2024 (TW) ................................. 113112996

(51) Int. Cl.
*H03M 11/00* (2006.01)
(52) U.S. Cl.
CPC ................................. *H03M 11/003* (2013.01)
(58) Field of Classification Search
CPC ............................ H03M 11/00; H03M 11/003
See application file for complete search history.

(56) References Cited

U.S. PATENT DOCUMENTS

| | | | | |
|---|---|---|---|---|
| 4,599,608 A | * | 7/1986 | Matsuoka | H03M 11/20 341/26 |
| 8,159,372 B2 | * | 4/2012 | Sherman | H03M 11/003 341/26 |
| 2024/0113731 A1 | * | 4/2024 | Chang | G06F 3/0202 |

* cited by examiner

*Primary Examiner* — Franklin D Balseca
(74) *Attorney, Agent, or Firm* — Thomas Horstemeyer, LLP

(57) ABSTRACT

An anti-ghosting keyboard includes a sensing unit, a detection unit, and a processing unit. The sensing unit includes a plurality of sensing modules, each of which includes N number of switches and N number of sensing resistors, where N is a positive integer greater than one. The detection unit includes a divider resistor that is connected in series with one of the sensing modules, and a detection module that is connected to a point of connection between the sensing unit and the divider resistor. The detection module obtains a divided voltage value across the divider resistor and generates a potential level value based on the divided voltage value. The processing unit is electrically connected to the detection module for receiving the potential level value therefrom, and generates a key-press signal that corresponds to the one of the sensing modules based on the potential level value thus received.

11 Claims, 7 Drawing Sheets

ANTI-GHOSTING KEYBOARD

CROSS-REFERENCE TO RELATED APPLICATION

This application claims priority to Taiwanese Invention Patent Application No. 113112996, filed on Apr. 8, 2024, the entire disclosure of which is incorporated by reference herein.

FIELD

The disclosure relates to a keyboard, and more particularly to an anti-ghosting keyboard.

BACKGROUND

Referring to FIG. 1, a first conventional keyboard (as described in U.S. Pat. No. 5,386,584A) includes a switching unit 1, a driving unit 2 and a sensing unit 3. The switching unit 1 includes a plurality of driving lines 111 to 114, a plurality of sensing lines 121 to 124, and a plurality of switching modules 13. Each of the switching modules 13 includes a switch 131 that is electrically connected in between one of the driving lines 111 to 114 and a corresponding one of the sensing lines 121 to 124. By way of the driving unit 2 sending driving signals (usually voltage signals) to the driving lines 111 to 114 one by one, and the sensing unit 3 detecting the driving signals received from the sensing lines 121 to 124, the sensing unit 3 is able to determine which, if any, of the switches 131 are being activated (i.e., which of the switches 131 are being closed to form closed circuits).

However, when three of the switches 131 that are marked by square boxes in FIG. 1 are simultaneously being activated, in addition to the aforementioned three switches 131 that were determined to be activated, the switch 131 that is marked by a circle in FIG. 1 will also be determined as being activated, resulting in a generation of a so-called "ghost key".

Referring to FIG. 2, U.S. Pat. No. 5,386,584A provides a second conventional keyboard to overcome the generation of the "ghost key". The second conventional keyboard differs from the first conventional keyboard in that, each of the switching modules 13 of the second conventional keyboard further includes a diode 132 connected in series with the switch 131. This diodes 132 prohibit continuity in between the driving lines 111 to 114, thereby preventing a driving signal sent into the driving line 113 from flowing into the sensing unit 3 via the sensing line 123 when the switches 131 that are marked by square boxes in FIG. 2 are being activated, so the switch 131 that is marked by a circle in FIG. 2 would not be determined as being activated, and the "ghost key" phenomenon is not generated.

However, the second conventional keyboard as shown in FIG. 2 requires additional diodes 132, and a number of the diodes 132 increases correspondingly according to a number of the switches 131, thus leading to an increase in overall cost.

SUMMARY

Therefore, an object of the disclosure is to provide an anti-ghosting keyboard that can alleviate at least one of the drawbacks of the prior art.

According to the disclosure, the anti-ghosting keyboard includes a sensing unit, a detection unit and a processing unit.

The sensing unit includes a plurality of sensing modules. Each of the sensing modules includes N number of switches and N number of sensing resistors, where N is a positive integer greater than one. The N number of sensing resistors correspond respectively to the N number of switches. For each of the sensing modules, resistance values respectively of the N number of sensing resistors form an ascending sequence, and any one of the resistance values in the ascending sequence, except for a first one of the resistance values, is greater than a sum of all of those of the resistance values before the any one of the resistance values in the ascending sequence. For each of the sensing modules, a conduction status of the N number of switches causes the sensing module to produce an equivalent resistance value, which is one of $2^N$ number of possible equivalent resistance values that respectively correspond to $2^N$ number of possible conduction statuses of the N number of switches.

The detection unit includes a divider resistor that is connected in series with one of the sensing modules, and a detection module that is electrically connected to a point of connection between the sensing unit and the divider resistor. The detection module is configured to obtain a divided voltage value across the divider resistor and to generate, based on the divided voltage value, a potential level value that corresponds to a proportion between the equivalent resistance value of the one of the sensing modules and a resistance value of the divider resistor.

The processing unit is electrically connected to the detection module for receiving the potential level value therefrom, and is configured to generate a key-press signal that corresponds to the one of the sensing modules based on the potential level value thus received.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
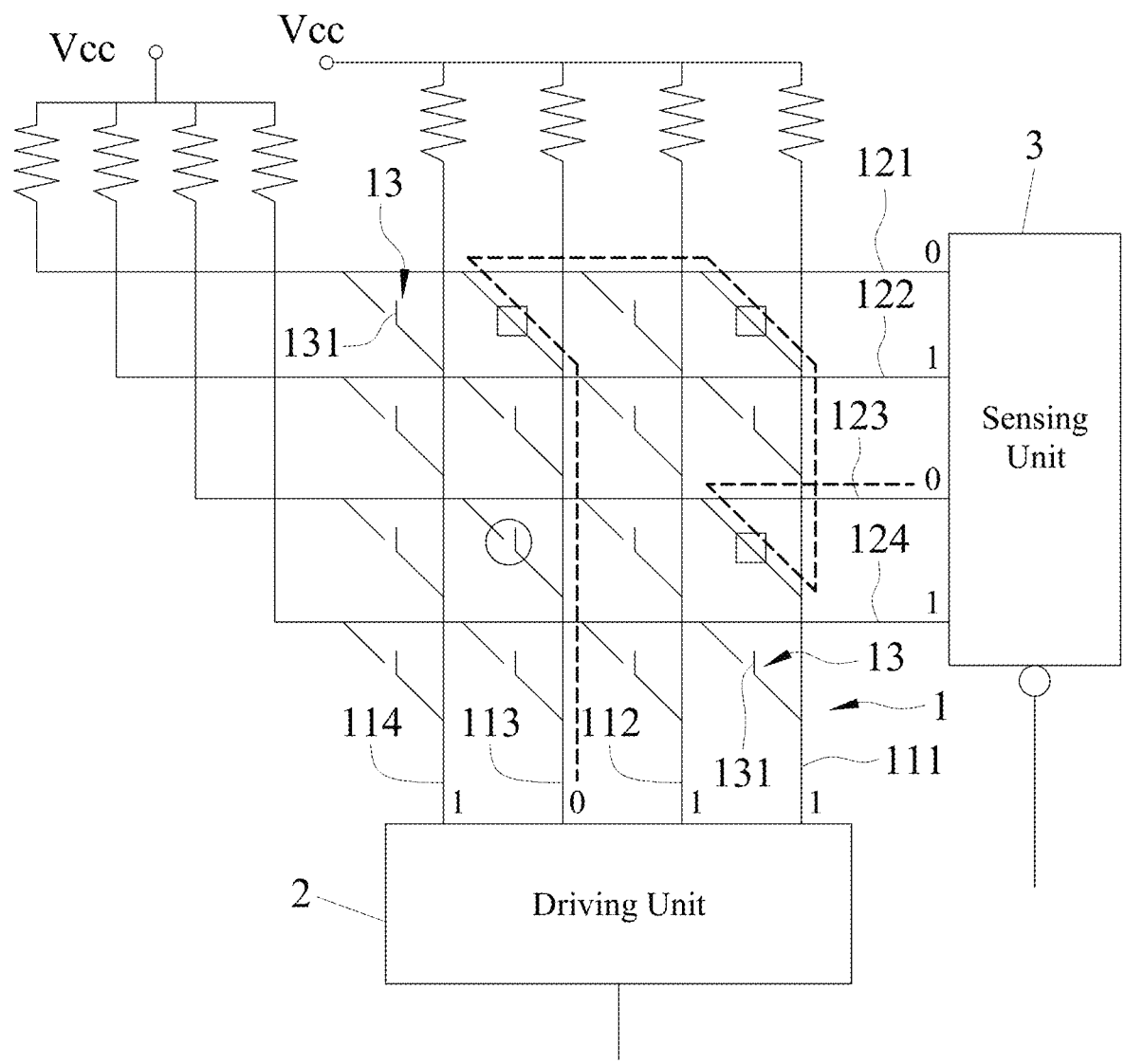
FIG. 1 is a circuit block diagram illustrating a first conventional keyboard.
Figure 2:
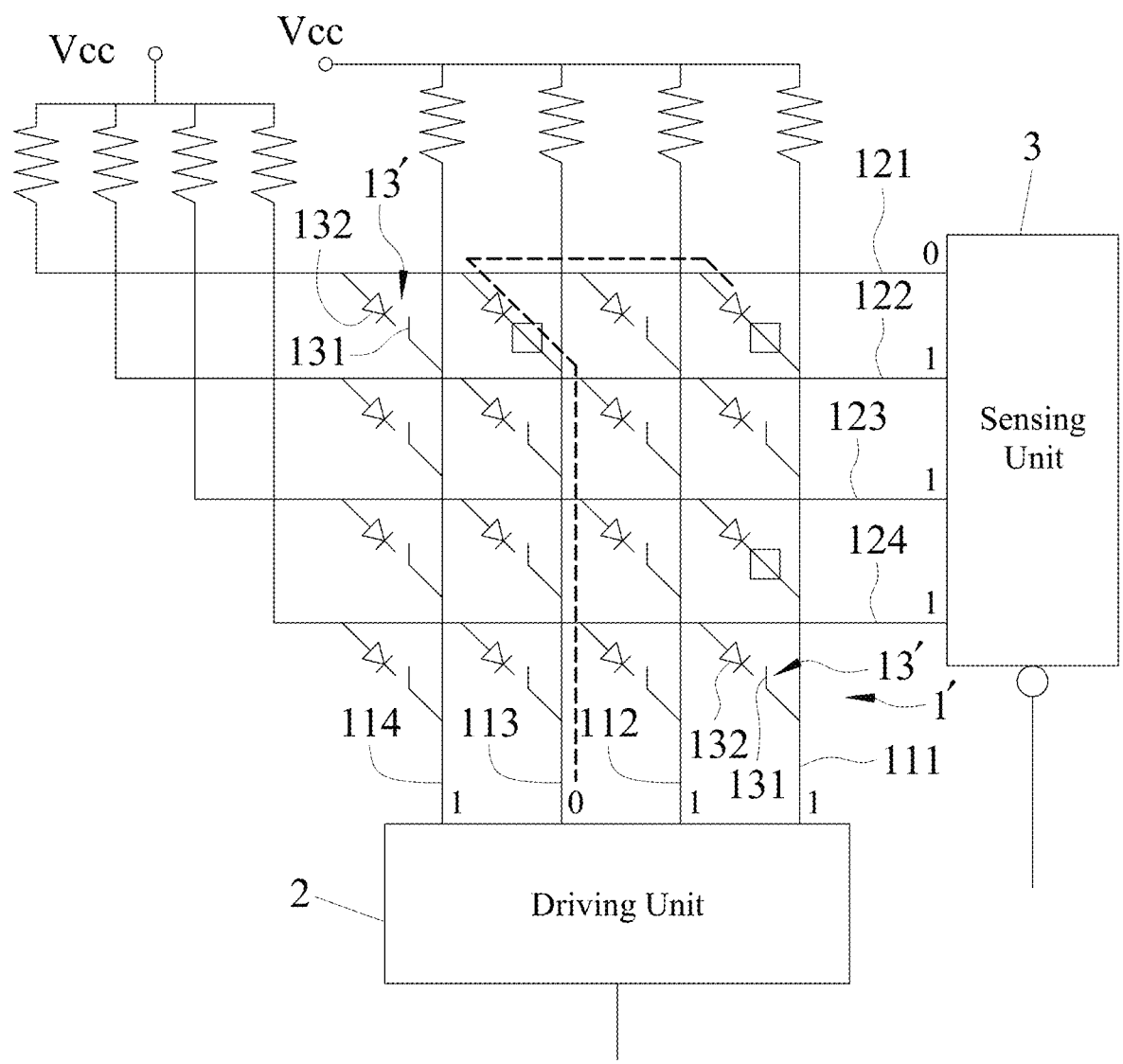
FIG. 2 is a circuit block diagram illustrating a second conventional keyboard.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 3:
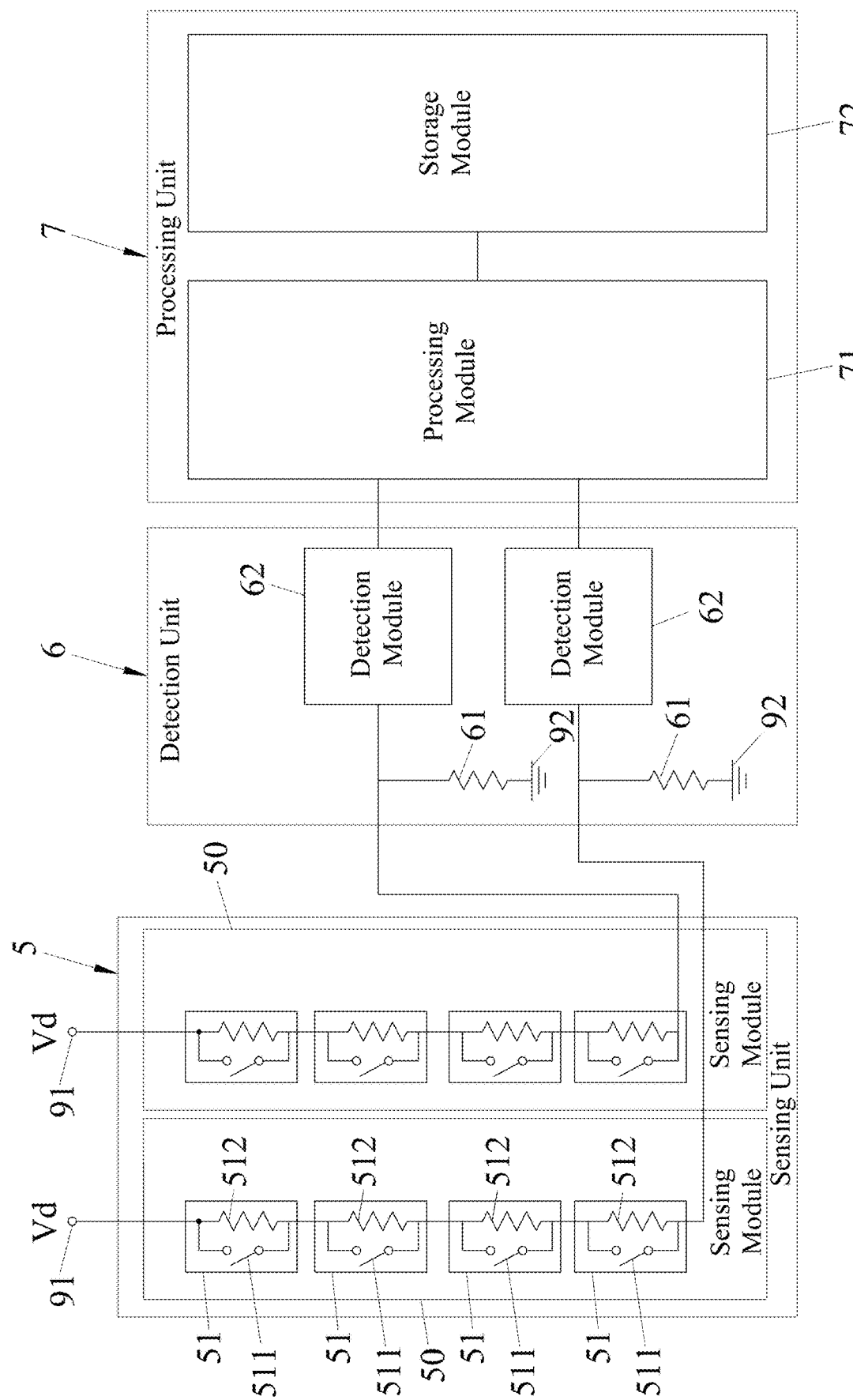
FIG. 3 is a circuit block diagram illustrating an anti-ghosting keyboard according to a first embodiment of the present disclosure.

Referring to FIG. 3, an anti-ghosting keyboard according to a first embodiment of this disclosure is adapted to be connected to a power source terminal 91 and a ground terminal 92. The anti-ghosting keyboard includes a sensing unit 5, a detection unit 6, and a processing unit 7.

The sensing unit 5 includes a plurality of sensing modules 50. In this embodiment, a number of the sensing modules 50 is two, but is not limited to such.

Each of the sensing modules 50 includes N number of switches 511 and N number of sensing resistors 512, where N is a positive integer greater than one. The N number of sensing resistors 512 correspond respectively to the N number of switches 511. For each of the sensing modules 50, resistance values respectively of the N number of sensing resistors 512 form an ascending sequence, and any one of the resistance values in the ascending sequence, except for a first one of the resistance values, is greater than a sum of all of those of the resistance values before itself (i.e., said any one of the resistance values) in the ascending sequence. A conduction status of the N number of switches 511 causes the sensing module 50 to produce an equivalent resistance value, which is one of $2^N$ number of possible equivalent resistance values that respectively correspond to $2^N$ number of possible conduction statuses of the N number of switches 511.

In this embodiment, the N number of switches 511 are respectively connected in parallel with the N number of sensing resistors 512 so as to cooperatively define N number of sensing switch sets 51. The N number of sensing switch sets 51 are connected in series. Each of the sensing modules 50 has an end that is connected to the power source terminal 91 for receiving voltage (Va) therefrom, and another end that is electrically connected to the detection unit 6.

The illustrative embodiment is exemplified to include four switches 511 and four sensing resistors 512 (i.e., N=4), and the resistance values respectively of the sensing resistors 512 are exemplified as 1 kΩ, 2 kΩ, 4 kΩ, and 8 kΩ, so the ascending sequence can be represented as [1k, 2k, 4k, 8k]. Specifically, the ascending sequence formed by the resistance values respectively of the sensing resistors 512 is a geometric sequence having a common ratio of two. Using a leftmost one of the sensing modules 50 in FIG. 3 as an example, the sensing resistors 512 are arranged from top to bottom in the ascending sequence of 1 kΩ, 2 kΩ, 4 kΩ, and 8 kΩ. When all of the switches 511 are not activated (i.e., all of the switches 511 are open), the equivalent resistance value of the sensing module 50 is equal to a sum of the resistance values of all the sensing resistors 512. When one or more of the switches 511 is activated (i.e., one or more of the switches 511 are closed), the equivalent resistance value of the sensing module 50 is equal to the sum of the resistance values of all the sensing resistors 512 minus the resistance value(s) of the sensing resistor(s) 512 that corresponds to the activated switches 511. Since the resistance values of the sensing resistors 512 are arranged in the given rule (i.e., any one of the resistance values in the ascending sequence, except for a first one of the resistance values, is greater than a sum of all of those of the resistance values before itself in the ascending sequence), the subtracted resistance value would be unique when any combination of the switches 511 is being activated, and thus the four switches 511 may produce sixteen (i.e., $2^4$=16) distinct conduction statuses and correspondingly produce sixteen different equivalent resistance values for each of the sensing modules 50.

The detection unit 6 includes a plurality of divider resistors 61 that are respectively connected in series with the sensing modules 50 (namely, each of the divider resistors 61 is connected to the corresponding one of the sensing module 50 at any time when the anti-ghosting keyboard is operating), and a plurality of detection modules 62 that are respectively electrically connected to points of connection between the sensing modules 50 and the divider resistors 61. Each of the divider resistors 61 has a resistance value that is substantially the same as a last one of the resistance values in the ascending sequence that corresponds to the respective one of the sensing modules 50. Each of the detection modules 62 is configured to obtain a divided voltage value across the respective one of the divider resistors 61 and to generate, based on the divided voltage value, a potential level value that corresponds to a proportion between the equivalent resistance value of the respective one of the sensing modules 50 and a resistance value of the respective one of the divider resistors 61.

In this embodiment, the detection unit 6 includes two divider resistors 61 that are respectively connected in series with the sensing modules 50, and two detection modules 62 that are respectively electrically connected to points of connection between the sensing modules 50 and the divider resistors 61. Each of the divider resistors 61 has an end opposite to the respective one of the sensing modules 50, and the end is connected to the ground terminal 92. Each of the detection modules 62 generates the potential level value based on the divided voltage value across the respective one of the divider resistors 61.

The processing unit 7 includes a processing module 71 (e.g., a microcontroller) and a storage module 72 (e.g., an electrically erasable programmable read-only memory (EEPROM) or a flash memory). The processing module 71 is electrically connected to the detection modules 62 and the storage module 72. The storage module 72 stores the potential level values that correspond respectively to the sensing modules 50. The processing module 71 is configured to generate, for each of the detection modules 62 and based on the potential level value received from the detection module 62, a key-press signal that corresponds to one of the sensing modules 50 the detection module 62 is connected to. That is to say, each of the key-press signals corresponds to the conduction status of the switches 511 of a respective one of the sensing modules 50, and the number of the sensing modules 50 determines a number of the key-press signals.

Referring to Table 1 below, and using 8-bit resolution commercial analog-to-digital converters as an example of the detection modules 62, the processing unit 7 may receive the potential level values in digital numbers from 1 to 256. Referring to the leftmost one of the sensing modules 50 in FIG. 3 again, where the sensing resistors 512 are exemplified as having respectively the resistance values of 1 kΩ, 2 kΩ, 4 kΩ, and 8 kΩ from top to bottom, the switches 511 are represented respectively as 'A', 'B', 'C' and 'D' from top to bottom in Table 1, and Table 1 presents for each row, in a first column the switches 511 that are activated, in a second column a corresponding voltage ratio (i.e., a ratio of the voltage (Vd) applied to the divider resistor 61, which equals a proportion of the resistance value of the divider resistor 61 to a sum of the resistance value of the divider resistor 61 and the equivalent resistance value of the sensing module 50), in a third column the potential level value corresponding to the voltage ratio, and in a fourth column a difference in the potential level values with respect to the potential level value of a current row with the potential level value of a previous row. Generally, a least significant bit error of an output signal of current commercial analog-to-digital converters is between ±1. For example, a theoretical value of the potential level value when none of the switches 511 are activated is 89, but an actual potential level value that is being outputted is usually one of 88, 89, and 90. Hence, when the difference in potential level values of any two potential level values is four or greater, a possibility of two of the potential level values that correspond to any two of the conduction statuses of the switches 511 having overlapping potential level values may be avoided, and the conduction status of the switches 511 can be clearly determined.

TABLE 1

| Activated Switches 511 | Voltage ratio | Potential level value | Potential level value difference |
|---|---|---|---|
| None | 0.35 | 89 | — |
| A | 0.36 | 93 | 4 |
| B | 0.38 | 98 | 5 |
| A + B | 0.40 | 102 | 4 |
| C | 0.42 | 108 | 6 |
| A + C | 0.44 | 114 | 6 |
| B + C | 0.47 | 120 | 6 |
| A + B + C | 0.50 | 128 | 8 |
| D | 0.53 | 137 | 9 |
| A + D | 0.57 | 146 | 9 |
| B + D | 0.62 | 158 | 12 |
| A + B + D | 0.67 | 171 | 13 |
| C + D | 0.73 | 186 | 15 |
| A + C + D | 0.80 | 205 | 19 |
| B + C + D | 0.89 | 228 | 23 |
| A + B + C + D | 1.00 | 256 | 28 |

Figure 4:
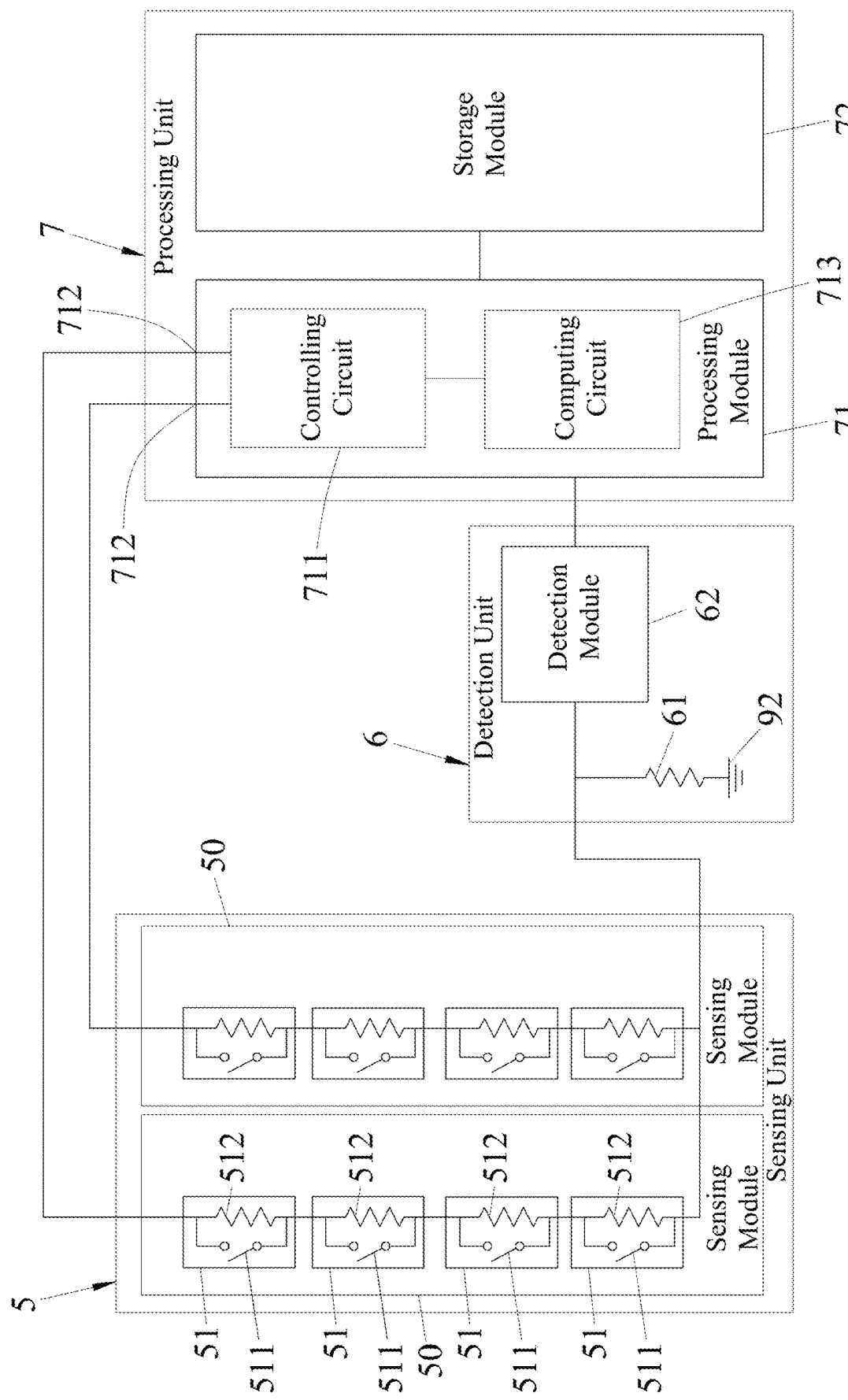
FIG. 4 is a circuit block diagram illustrating the anti-ghosting keyboard according to a second embodiment of the present disclosure.

Referring to FIG. 4, the anti-ghosting keyboard according to a second embodiment of this disclosure is provided. Referring to FIGS. 3 and 4, similar to the first embodiment, the anti-ghosting keyboard in this embodiment also includes a sensing unit 5, a detection unit 6, and a processing unit 7.

Aspects of the second embodiment that are different from the first embodiment are described below.

Each of the sensing modules 50 has a first end that is electrically connected to the processing unit 7, and a second end that is opposite to the first end and that is electrically connected to the detection unit 6.

The detection unit 6 includes a divider resistor 61 that is connected in series with the sensing unit 5, and a detection module 62 that is electrically connected to a point of connection between the sensing unit 5 and the divider resistor 61. The divider resistor 61 has an end opposite to the sensing modules 50, and the end is connected to the ground terminal 92. The detection module 62 is configured to obtain a plurality of divided voltage values across the divider resistor 61 in sequence that correspond respectively to the sensing modules 50, and is further configured to generate, based respectively on the divided voltage values, a plurality of potential level values that correspond respectively to the sensing modules 50. Specifically, the detection module 62 obtains the divided voltage values in sequence one at a time, each time corresponding to a respective one of the sensing modules 50, and generates, based on the divided voltage value that is obtained at the time, the potential level value that corresponds to the respective one of the sensing modules 50.

The processing module 71 includes a controlling circuit 711 and a computing circuit 713. The controlling circuit 711 includes a plurality of power supply terminals 712 that are electrically connected respectively to the sensing modules 50. Specifically, for each of the sensing modules 50, the first end is electrically connected to a respective one of the power supply terminals 712 of the controlling circuit 711, and the second end is electrically connected to the divider resistor 61. The controlling circuit 711 is configured to supply power to the sensing modules 50 in sequence respectively through the plurality of power supply terminals 712. Specifically, the controlling circuit 711 supplies power to the sensing modules 50 one at a time, each time to a respective one of the sensing modules 50. In other words, when said anti-ghosting keyboard is operating, the divider resistor 61 is connected in series with each of the sensing modules (50), one at a time. The computing circuit 713 is electrically connected to the detection module 62 and is configured to generate, based respectively on the potential level values that are obtained in sequence, a plurality of the key-press signals that correspond respectively to the sensing modules 50. Specifically, the computing circuit 713 obtains the potential level values in sequence one at a time, each time the computing circuit 713 generates the key-press signal that corresponds to the respective one of the sensing modules 50 based on the potential level value that is obtained at the time. The storage module 72 stores the potential level values that correspond respectively to the sensing modules 50.

For example, the computing circuit 713 transmits a driving signal that marks a leftmost one of the sensing modules 50 in FIG. 4 to the controlling circuit 711, causing the controlling circuit 711 to supply power to the leftmost one of the sensing modules 50 via the respective one of the power supply terminals 712. Then, the detection module 62 generates, based on the divided voltage value that is obtained at the time, the potential level value that corresponds to the conduction status of the switches 511 of the leftmost one of the sensing modules 50 at the time, and transmits the potential level value to the computing circuit 713. The computing circuit 713 then transmits the potential level value to the storage module 72 to be stored therein. Finally, the computing circuit 713 binds the potential level value to the leftmost one of the sensing modules 50 marked by the driving signal according to the potential level value and the driving signal at the time, and generates the key-press signal that corresponds to the leftmost one of the sensing modules 50 (i.e., indicating the conduction status of the switches 511 of the leftmost one of the sensing modules 50).

In the second embodiment, by virtue of the controlling circuit 711 sequentially sending the driving signals to the sensing modules 50 one by one, the potential level values that correspond respectively to the conduction statuses of the switches 511 of the sensing modules 50 may be obtained in sequence, enabling the conduction status of the switches 511 of each of the sensing modules 50 to be clearly determined. In this embodiment, the detection unit 6 uses only one detection module 62, which may simplify the configuration and reduce the cost of the detection unit 6.

Figure 5:
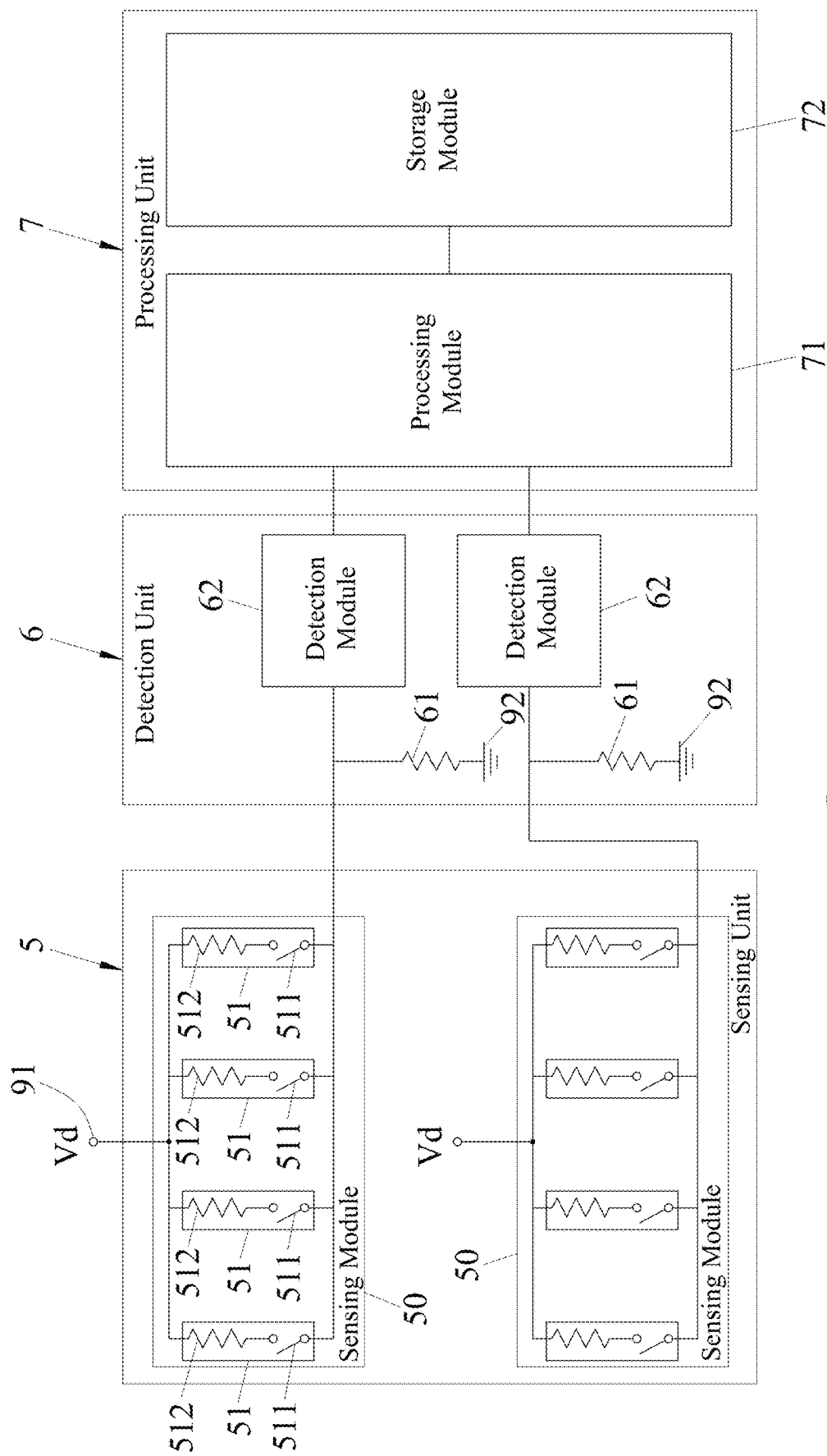
FIG. 5 is a circuit block diagram illustrating the anti-ghosting keyboard according to a third embodiment of the present disclosure.

Referring to FIG. 5, the anti-ghosting keyboard according to a third embodiment of this disclosure is provided. Referring to FIGS. 3 and 5, similar to the first embodiment, the anti-ghosting keyboard in this embodiment also includes a sensing unit 5, a detection unit 6, and a processing unit 7.

Aspects of the third embodiment that are different from the first embodiment are described below.

Figure 6:
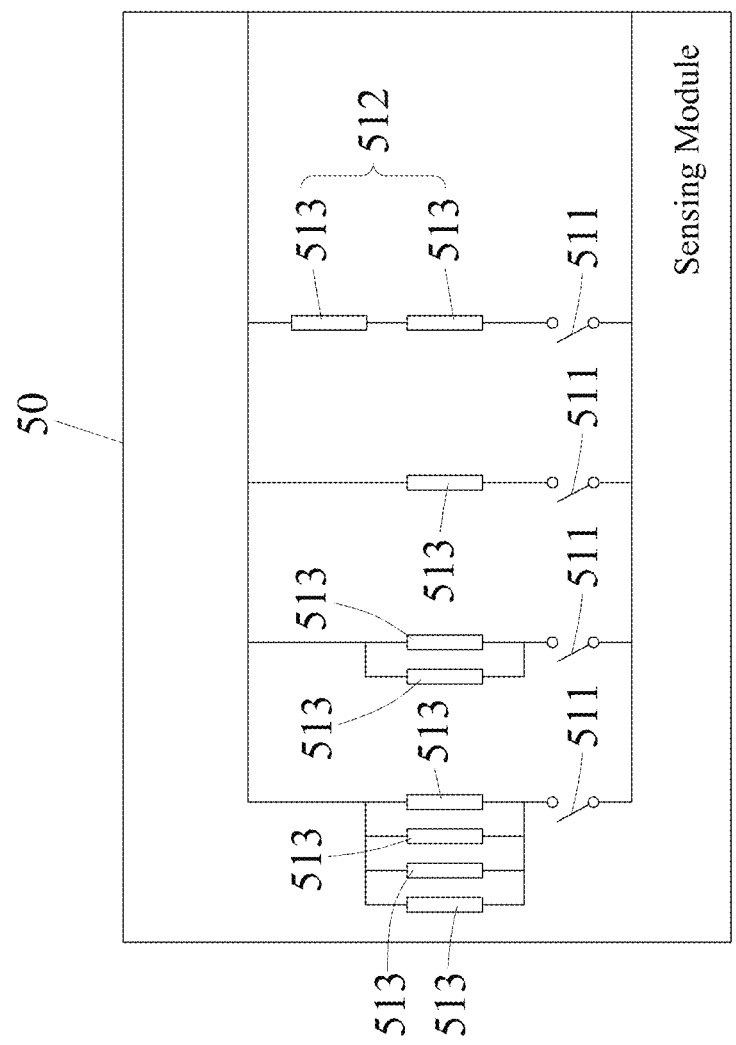
FIG. 6 is a schematic diagram illustrating a sensing module according to the third embodiment of the present disclosure.

Referring to FIGS. 3, 5 and 6, for each of the sensing modules 50, the switches 511 are respectively connected to the sensing resistors 512 in series to cooperatively define the sensing switch sets 51, and the sensing switch sets 51 are connected in parallel. In this embodiment, since the ascending sequence formed by the resistance values of the sensing resistors 512 is also the geometric sequence with the common ratio of two, each of the sensing resistors 512 may be formed by including one printed resistor 513 or by connecting multiple printed resistors 513 of equal sizes (see FIG. 6) in parallel or in series, thereby achieving consistency in a production of resistors.

In this embodiment, for each of the divider resistors 61, the resistance value of the divider resistor 61 is substantially the same as a first one of the resistance values in the ascending sequence that corresponds to the sensing resistors 512 of the respective one of the sensing modules 50.

In this embodiment, since the sensing resistors 512 are connected in such a way (as shown in FIG. 6) that the $2^N$ number of possible equivalent resistance values (i.e., $2^4=16$) produced by each of the sensing modules 50 are generally lower than the $2^N$ number of possible equivalent resistance values produced by each of the sensing modules 50 in the first embodiment, the resistance value of each of the divider resistors 61, in this embodiment, needs to be correspondingly lowered to be substantially the same as the first one of the resistance values in the ascending sequence so that the difference between any two of the potential level values resulting from different conduction statuses of the switches 511 of any one of the sensing modules 50 may still be equal to or greater than four, and the conduction statuses of the switches 511 may still be clearly determined. The table description for the third embodiment is similar to Table 1 and will not be repeated here for the sake of brevity.

Figure 7:
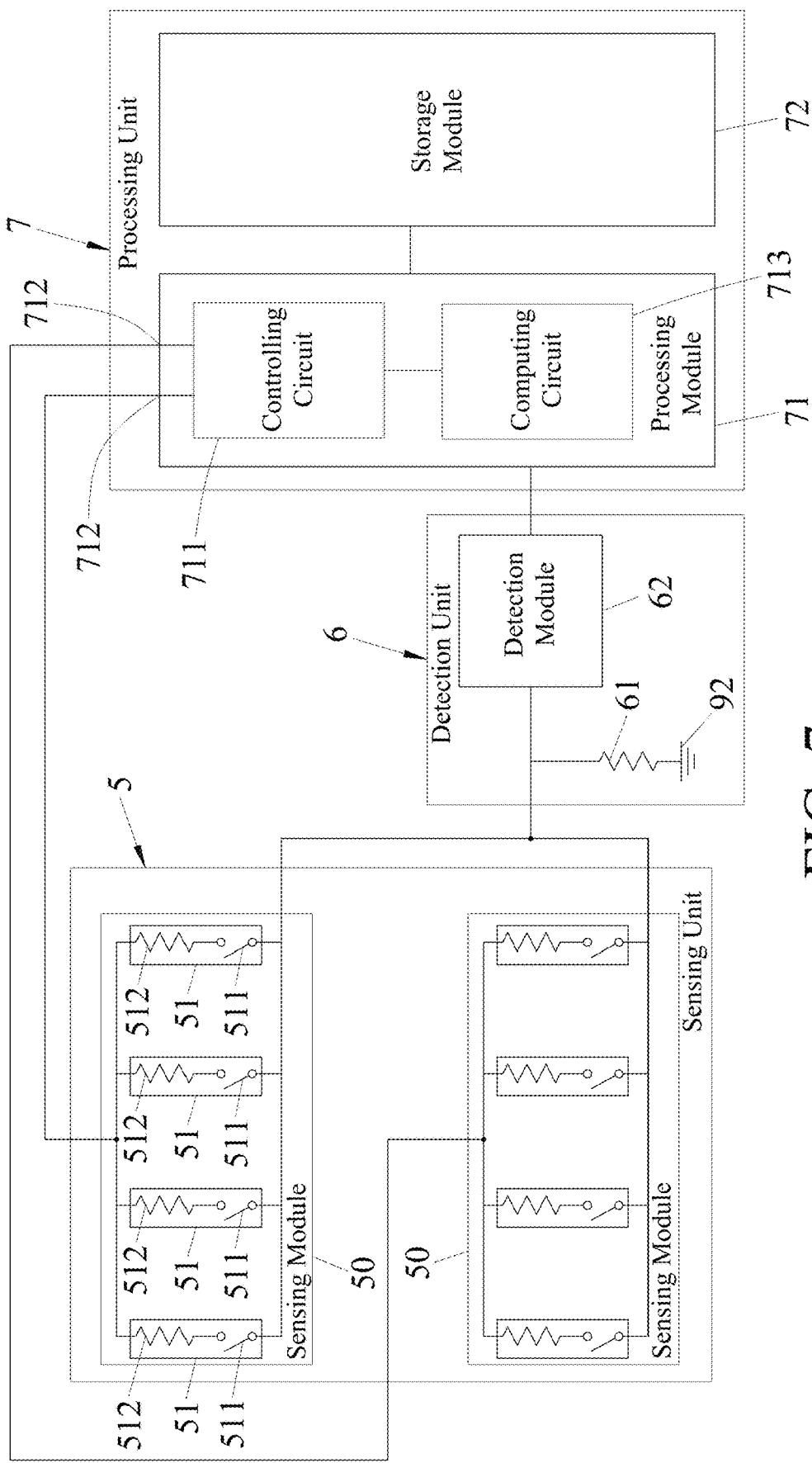
FIG. 7 is a circuit block diagram illustrating the anti-ghosting keyboard according to a variation of the third embodiment of the present disclosure.

Referring to FIG. 7, the anti-ghosting keyboard according to a variation of the third embodiment is provided. In this variation, the third embodiment is modified according to the second embodiment. Similar to the second embodiment, in this variation, the detection unit 6 includes a divider resistor 61 that is connected in series with the sensing unit 5, and a detection module 62 that is electrically connected to a point of connection between the sensing unit 5 and the divider resistor 61. The processing unit 7 includes a processing module 71 and a storage module 72. The processing module 71 includes a controlling circuit 711 and a computing circuit 713. The controlling circuit 711 includes a plurality of power supply terminals 712 that are electrically connected respectively to the sensing modules 50, and supplies power to the sensing modules 50 in sequence one at a time, each time to the respective one of the sensing modules 50. The computing circuit 713 is electrically connected to the detection module 62 and generates, based respectively on the potential level values that are obtained in sequence, a plurality of the key-press signals that correspond respectively to the sensing modules 50. Specifically, the computing circuit 713 obtains the potential level values one at a time, each time the computing circuit 713 generates the key-press signal that corresponds to the respective one of the sensing modules 50. In this variation, the conduction status of the switches 511 may also be clearly determined. A table description for this variation of the third embodiment is similar to Table 1 and will not be repeated here for the sake of brevity.

In sum, each of the sensing modules 50 includes N number of switches 511 and N number of sensing resistors 512, and resistance values respectively of the N number of sensing resistors 512 form the ascending sequence. Any one of the resistance values in the ascending sequence, except for the first one of the resistance values, is greater than the sum of all of those of the resistance values before itself in the ascending sequence. The N number of switches 511 causes the sensing module 50 to produce $2^N$ number of possible equivalent resistance values that respectively correspond to $2^N$ number of possible conduction statuses of the N number of switches 511. The detection unit 6 obtains the divided voltage value and generates the potential level value based on the divided voltage value, and the processing unit 7 determines the conduction status of the switches 511 of the corresponding one of the sensing modules 50. Through the aforementioned configurations, the anti-ghosting keyboard according to this disclosure is able to determine which of the switches 511 is/are activated (i.e., which of the key(s) are being pressed by a user on the anti-ghosting keyboard), and the generation of "ghost key" can be prevented without the need to install additional diodes.

Additionally, the anti-ghosting keyboard according to the second embodiment and the variation of the third embodiment uses only one detection module 62, and is able to prevent the generation of "ghost key" by virtue of the controlling circuit 711 of the processing unit 7 sending out driving signals in sequence one by one to the respective one of the sensing modules 50, and the computing circuit 713 obtaining in sequence the potential level value that corresponds to the respective one of the sensing modules 50.

Furthermore, by virtue of the ascending sequence being the geometric sequence that has the common ratio of two, each of the sensing resistors 512 may be formed by including one printed resistor 513 or by connecting multiple printed resistors 513 of equal sizes in parallel or in series, thereby achieving consistency in the production of resistors.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An anti-ghosting keyboard, comprising:
a sensing unit including a plurality of sensing modules, each of said sensing modules including N number of switches and N number of sensing resistors, said N number of sensing resistors corresponding respectively to said N number of switches, where N is a positive integer greater than one,
wherein for each of said sensing modules, resistance values respectively of said N number of sensing resistors form an ascending sequence, and any one of the resistance values in the ascending sequence, except for a first one of the resistance values, is greater than a sum of all of those of the resistance values before said any one of the resistance values in the ascending sequence, and
wherein for each of said sensing modules, a conduction status of said N number of switches causes said sensing module to produce an equivalent resistance value, which is one of $2^N$ number of possible equivalent resistance values that respectively correspond to $2^N$ number of possible conduction statuses of said N number of switches;
a detection unit including at least one divider resistor that is connected in series with at least one of said sensing modules, and at least one detection module that is electrically connected to at least one point of connection between said sensing unit and said at least one divider resistor, said at least one detection module being configured to obtain at least one divided voltage value across said at least one divider resistor and to generate, based on the at least one divided voltage value, at least one potential level value that corresponds to a proportion between the equivalent resistance value of said at least one of said sensing modules and a resistance value of said at least one divider resistor; and
a processing unit electrically connected to said at least one detection module for receiving the at least one potential level value therefrom, and configured to generate at least one key-press signal that corresponds to said at least one of said sensing modules based on the at least one potential level value thus received.

2. The anti-ghosting keyboard as claimed in claim 1, wherein for each of said sensing modules, each of said N number of sensing resistors includes a printed resistor.

3. The anti-ghosting keyboard as claimed in claim 1, wherein for each of said sensing modules, said N number of switches are respectively connected in parallel with said N number of sensing resistors so as to cooperatively define N number of sensing switch sets, said N number of sensing switch sets being connected in series; and
wherein the resistance value of said at least one divider resistor is substantially the same as a last one of the resistance values in the ascending sequence.

4. The anti-ghosting keyboard as claimed in claim 3, wherein said at least one divider resistor includes a plurality of divider resistors that are respectively connected in series with said sensing modules, and said at least one detection module includes a plurality of detection modules that are respectively electrically connected to points of connection between said sensing modules and said plurality of divider resistors;
wherein said processing unit is electrically connected to said plurality of detection modules and is configured to receive the at least one potential level value that includes a plurality of potential level values corresponding respectively to said plurality of detection modules, and to generate the at least one key-press signal that includes a plurality of key-press signals corresponding respectively to said sensing modules; and
wherein said processing unit is configured to generate, for each of said plurality of detection modules and based on one of the potential level values received from said detection module, one of the key-press signals that corresponds to one of said sensing modules to which said detection module is connected.

5. The anti-ghosting keyboard as claimed in claim 3, wherein said at least one detection module is configured to obtain the at least one divided voltage value including a plurality of divided voltage values across said at least one divider resistor in sequence that correspond respectively to said sensing modules, and is further configured to generate, based respectively on the plurality of divided voltage values, the at least one potential level value including a plurality of potential level values that correspond respectively to said sensing modules;
wherein said processing unit includes a processing module, said processing module including a controlling circuit and a computing circuit, said controlling circuit including a plurality of power supply terminals that are electrically connected respectively to said sensing modules, each of said sensing modules having a first end that is electrically connected to a respective one of said power supply terminals of said controlling circuit, and a second end that is opposite to said first end and that is electrically connected to said at least one divider resistor;
wherein said controlling circuit is configured to supply power to said sensing modules in sequence respectively through said plurality of power supply terminals; and
wherein said computing circuit is electrically connected to said at least one detection module and is configured to generate, based respectively on the plurality of potential level values, the at least one key-press signal including a plurality of key-press signals that correspond respectively to said sensing modules.

6. The anti-ghosting keyboard as claimed in claim 5, wherein said processing unit further includes a storage module that is electrically connected to said processing module, said storage module being configured to store the plurality of potential level values that correspond respectively to said sensing modules.

7. The anti-ghosting keyboard as claimed in claim 1, wherein for each of said sensing modules, said N number of switches are respectively connected to said N number of sensing resistors in series to cooperatively define N number of sensing switch sets, said N number of sensing switch sets being connected in parallel; and
wherein the resistance value of said at least one divider resistor is substantially the same as a first one of the resistance values in the ascending sequence.

8. The anti-ghosting keyboard as claimed in claim 7, wherein said at least one divider resistor includes a plurality of divider resistors that are respectively connected in series with said sensing modules, and said at least one detection module includes a plurality of detection modules that are respectively electrically connected to points of connection between said sensing modules and said plurality of divider resistors;
wherein said processing unit is electrically connected to said plurality of detection modules and is configured to receive the at least one potential level value that includes a plurality of potential level values corresponding respectively to said plurality of detection modules, and to generate the at least one key-press signal that includes a plurality of key-press signals corresponding respectively to said sensing modules; and wherein said processing unit is configured to generate, for each of said plurality of detection modules, one of the key-press signals that corresponds to one of said sensing modules based on one of the potential level values received from said detection module.

9. The anti-ghosting keyboard as claimed in claim 7, wherein said at least one detection module is configured to obtain the at least one divided voltage value including a plurality of divided voltage values across said at least one divider resistor in sequence that correspond respectively to said sensing modules, and is further configured to generate, based respectively on the plurality of divided voltage values, the at least one potential level value including a plurality of potential level values that correspond respectively to said sensing modules;

wherein said processing unit includes a processing module, said processing module including a controlling circuit and a computing circuit, said controlling circuit including a plurality of power supply terminals that are electrically connected respectively to said sensing modules, each of said sensing modules having a first end that is electrically connected to a respective one of said power supply terminals of said controlling circuit and a second end that is opposite to said first end and that is electrically connected to said at least one divider resistor;

wherein said controlling circuit is configured to supply power to said sensing modules in sequence respectively through said plurality of power supply terminals; and wherein said computing circuit is electrically connected to said at least one detection module and is configured to generate, based respectively on the plurality of potential level values, the at least one key-press signal including a plurality of key-press signals.

10. The anti-ghosting keyboard as claimed in claim 9, wherein said processing unit further includes a storage module that is electrically connected to said processing module, said storage module being configured to store the plurality of potential level values that correspond respectively to said sensing modules.

11. The anti-ghosting keyboard as claimed in claim 1, wherein for each of said sensing modules, the ascending sequence is a geometric sequence that has a common ratio of two.

* * * * *